United States Patent
Brock et al.

(10) Patent No.: US 6,444,408 B1
(45) Date of Patent: Sep. 3, 2002

(54) HIGH SILICON CONTENT MONOMERS AND POLYMERS SUITABLE FOR 193 NM BILAYER RESISTS

(75) Inventors: Phillip Joe Brock, Sunnyvale; Richard Anthony DiPietro, San Jose; Donald Clifford Hofer, San Martin; Ratnam Sooriyakumaran, San Jose; Gregory Michael Wallraff, Morgan Hill, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/514,212

(22) Filed: Feb. 28, 2000

(51) Int. Cl.[7] ............................ G03F 7/027; G03F 7/075
(52) U.S. Cl. ................. 430/322; 430/312; 430/313; 430/326; 430/270.1; 430/281.1
(58) Field of Search ............................... 430/312, 313, 430/322, 270.1, 281.1, 326

(56) References Cited

U.S. PATENT DOCUMENTS

| | | | | |
|---|---|---|---|---|
| 4,551,417 A | * | 11/1985 | Suzuki et al. | 430/316 |
| 4,624,909 A | * | 11/1986 | Satome et al. | 430/192 |
| 4,808,682 A | * | 2/1989 | Schwalm et al. | 526/279 |
| 5,063,134 A | * | 11/1991 | Horiguchi et al. | 430/192 |
| 5,068,169 A | * | 11/1991 | Takechi et al. | 430/313 |
| 5,158,854 A | * | 10/1992 | Imamura et al. | 430/192 |
| 5,342,734 A | * | 8/1994 | Lazarus et al. | 430/270.1 |
| 5,981,141 A | * | 11/1999 | Choi et al. | 430/270.1 |
| 5,985,524 A |  | 11/1999 | Allen et al. | 430/326 |
| 6,063,543 A | * | 5/2000 | Hien et al. | 430/270.1 |
| 6,103,448 A | * | 8/2000 | Kim et al. | 430/270.1 |
| 6,165,678 A | * | 12/2000 | Allen et al. | 430/270.1 |
| 6,177,228 B1 | * | 1/2001 | Allen et al. | 430/270.1 |
| 6,210,856 B1 | * | 4/2001 | Lin et al. | 430/270.1 |
| 6,358,675 B1 | * | 3/2002 | Boardman et al. | 430/326 |

FOREIGN PATENT DOCUMENTS

JP  2001-288224  * 10/2001

OTHER PUBLICATIONS

Sooriyakumaran et al., "A 193 nm Positive Tone Resist Based on Norborene–Maleic Anhydride Copolymers", 6/2000, Proceedings of SPIE, vol. 3999, pp. 1171–1180.*
Kunz.; SPIE–The International Society for Optical Engineering: Advances in Resist Technology and Processing XIII, *Bilayer Resist Approach for 193–nm Lithography;* vol. 2724; pp. 344–354 (1996).
Patterson, et al.; SPIE–The International Society for Optical Engineering: Advances in Resist Technology and Processing XV; *Improving the Performance of 193nm Photoresist Based on Alicylic Polymers;* vol. 3333 Pt. 1; pp. 425–437 (1998).
Kessel, et al.; SPIE–The International Society for Optical Engineering: Advances in Resist Technology and Processing XVI; Novel Silicon–Containing Resist for EUV and 193 nm Lithography; vol. 3678; pp. 214–220 (1999).

* cited by examiner

Primary Examiner—Mark F. Huff
Assistant Examiner—Nicole Barreca
(74) Attorney, Agent, or Firm—Connolly Bove Lodge & Hutz, LLP; Daniel E. Johnson, Esq.

(57) ABSTRACT

Polymerizable monomers having silicon containing groups that are transparent at 193 nm; and ethylenically unsaturated group are provided. Polymers from these monomers can be used in processes for forming sub-100 nm images with a chemically amplified, radiation sensitive bilayer resist. The bilayer resist is disposed on a substrate and comprises (i) a top imaging layer comprising a radiation sensitive acid generator and (ii) an organic underlayer. The bilayer resist can be used in the manufacturing of integrated circuits.

26 Claims, 6 Drawing Sheets

Prior Art

Prior Art

Inactive         Active (acid labile)

HIGH SILICON CONTENT MONOMERS AND POLYMERS SUITABLE FOR 193 NM BILAYER RESISTS

TECHNICAL FIELD

The present invention relates to new silicon containing monomers which are transparent at 193 nm and copolymers obtained from these silicon containing monomers. The copolymers of the present invention are especially suitable for forming radiation sensitive bilayer resists. The bilayer resists can be used in the manufacture of integrated circuits.

BACKGROUND OF INVENTION

In the fabrication of integrated circuits, one of the more critical procedures is the lithographic processing. Improving lithographic techniques is a continuing demand in view of the ever increasing desire in the semiconductor industry for higher circuit density in microelectronic devices.

One method of achieving higher area density is to improve the resolution of circuit patterns in resist films. It is known in the art that increasing the numerical aperture (NA) of the lens system of the lithographic imaging tool increases the resolution at a given wavelength. However, increasing the NA results in a decrease in the depth of focus (DOF) of the imaging radiation, thereby requiring a reduction in the thickness of the imaging resist film. Further, the industry wide shift to shorter wavelength exposure systems also results in as decrease in the DOF. A decrease in the resist film thickness can lead to problems in subsequent processing steps (e.g., ion implantation and etching).

In order to overcome these problems, bilayer resists have been developed. Bilayer resists generally comprise a top thin film imaging layer coated on a thick organic underlayer. The resist is patterned by (i) imagewise exposure and development of the top layer, and then (ii) anisotropically transferring the developed pattern in the top layer through the thick underlayer to the substrate. Suitably, the top layer contains precursors to refractory oxides such as silicon, boron, or germanium which enable the use of oxygen-reactive ion etching (RIE) in the image transfer step.

Bilayer resists are known in the art, however, these resists were generally developed before the advent of deep U.V. lithography (e.g., 248 nm and 193 nm) and are of little utility for high resolution imaging. The silicon containing bilayer photoresists are one of the more attractive candidates for possible use for 248 nm applications. There is currently a need to develop materials for the next generation of exposure systems at 193 nm (and perhaps 157 nm) as well. Unfortunately current generation DUV bilayer resists are not extendible to shorter wavelengths due to poor transparency at these shorter wavelengths. This high absorbance is due in large part to the aromatic poly(hydroxystyrene) moiety found in nearly all DUV 248 nm resists. However, certain structural types of silicon monomers can also contribute to the high absorbance at 193 nm. For example, the 4SiMA monomer (see FIG. 1), a tetrasilane containing Si—Si linkages, is disclosed in U.S. Pat. No. 5,985,524, inter alia, for use in bilayer resists. This is a very useful bilayer resist component due to its high silicon density and correspondingly high O2-RIE etch resistance at relatively low monomer loadings. Low silicon monomer loadings are generally desirable since silicon often negatively impacts the resist dissolution characteristics. Low loadings also provide greater latitude in the design of the polymer.

Unfortunately, the presence of Si—Si bonding in this monomer leads to unacceptably high absorbance at 193 nm. For example, a methacrylate polymer containing only 20 mole percent of this monomer (see FIG. 2; other monomers in this polymer are nearly transparent) has an absorbance of 6 per micron film, which makes this monomer unsuitable for 193 nm applications.

It has also been suggested to use a commercially available Si—O—Si containing monomer (see FIG. 3) in 193 nm bilayer resist development. See Schaedeli et al., "Bilayer Resist Approach for 193 nm Lithography", Proc. SPIE, Vol. 2724, pp. 344–354, 1996. However, the introduction of silicon-oxygen functionality into the monomer can have deleterious consequences on the resist performance. Particularly, these siloxanes often have poor hydrolytic stability under the processing conditions employed in these chemically amplified resists. This in turn can result in crosslinking reactions which can negatively impact the dissolution properties. In some cases, crosslinking occurring during the polymer preparation have been observed.

More recently, Kessel et al, "Novel Silicon-Containing Resists for EUV and 193 nm Lithography", Proc. SPIE, Vol. 3678, pp. 214–220, 1999 describe a bilayer resist claiming to be suitable for 193 nm resist applications. However, the polymer in this resist (see FIG. 6) contains a silicon containing monomer with Si—Si linkages similar to monomers in U.S. Pat. No. 5,989,524. As stated above, this 4Si group absorbs strongly at 193 nm, making it unsuitable for 193 nm resist applications (see FIG. 4 in reference 3 for examples of the poorly defined images that are a consequence of high polymer absorption). It is therefore an object of the present invention to provide an improved 193 nm bilayer resist. Other objects and advantages will become apparent from the following disclosure.

SUMMARY OF INVENTION

The present invention relates to new polymerizable monomers having silicon containing groups separated from each other by a group X wherein the group X is non-reactive and is transparent at 193 nm, and containing polymerizable ethylenically unsaturated group.

The present invention also relates to polymers from (a) a polymerizable monomer having silicon containing groups separated from each other by a group X wherein the group X is non-reactive and is transparent at 193 nm, and containing polymerizable ethylenically group.

A still further aspect of the present invention is concerned with a process for generating a bilayer resist image on a substrate. The process comprises:

(a) coating a substrate with an organic underlayer;
(b) coating the organic underlayer with a top layer comprising:
  (i) a radiation sensitive acid generator and
  (ii) a polymer from a polymerizable monomer having silicon containing groups separated from each other by a group X wherein the group X is non-reactive and is transparent at 193 nm, and containing polymerizable ethylenically unsaturated group, and being acid labile;
(c) imagewise exposing the top layer to radiation;
(d) developing the image in the top layer; and
(e) transferring the image through the organic underlayer to the substrate.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The polymerizable monomers of the present invention are capable of providing positive tone, chemically amplified polymer resists suitable for 193 nm applications.

Figure 8:
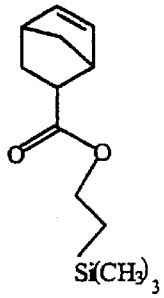
Figure 8:
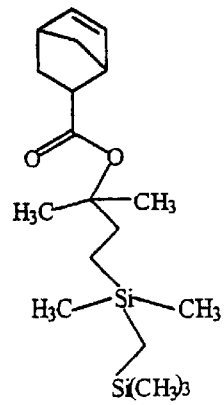
Figure 8:
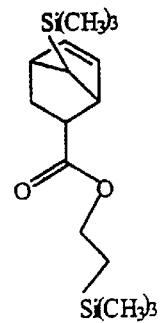
Figure 8:
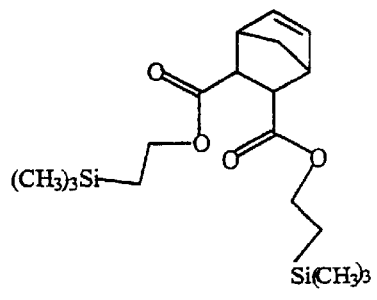
Figure 8:
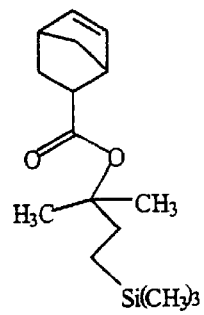
Figure 8:
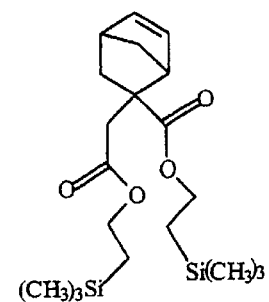
Figure 8:
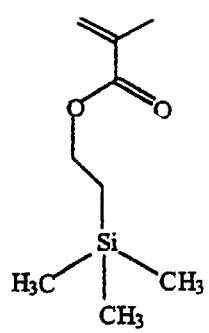
Figure 8:
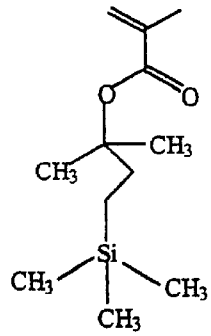
Figure 8:
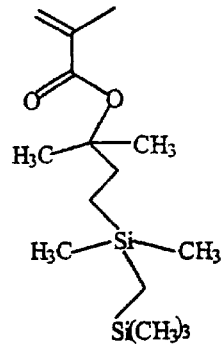
Figure 9:
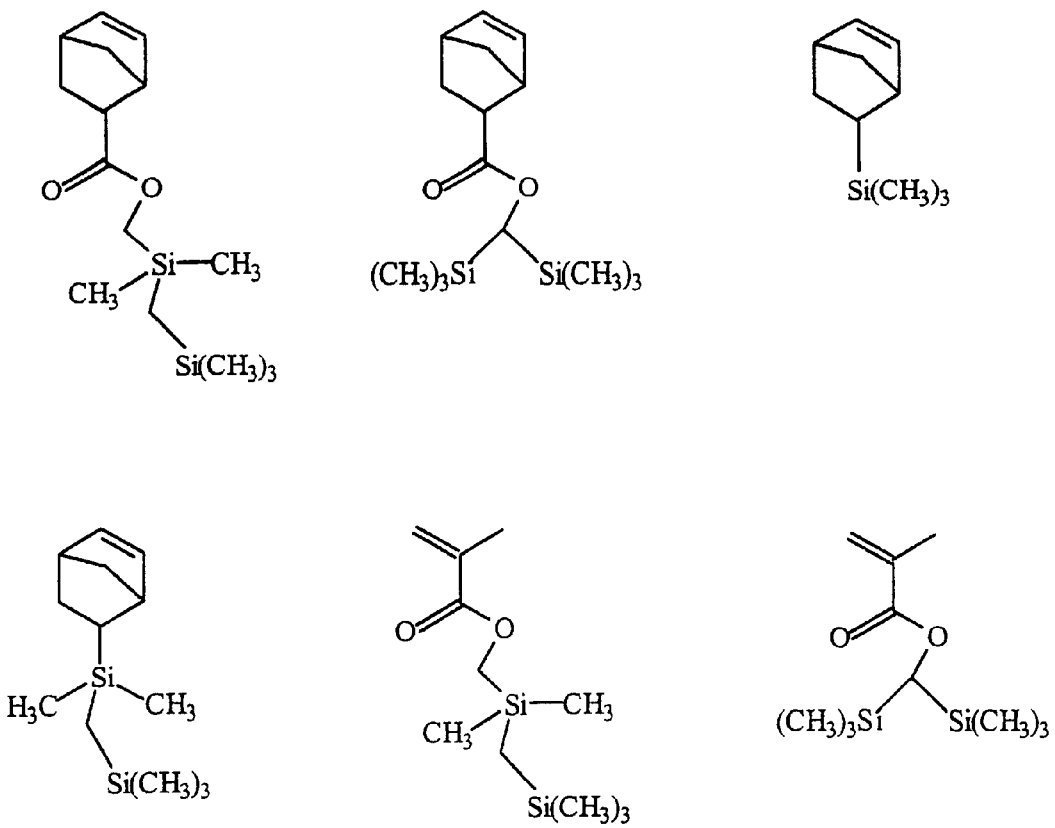
FIG. 9 illustrates structures of inactive silicon containing monomers suitable for use in the present invention.

The silicon-containing monomers of the present invention contain a group X that is non-absorbing at 193 nm and an ethylenically unsaturated group. The silicon containing monomers are either acid labile (active) or acid-stable (inactive). The group X is preferably an alkylene $(CR_2)n$ group wherein n is typically an integer of 1 to 4 and more typically 1 to 2. The bridging alkylene group is important in that it enables the monomer to be transparent at 193 nm. These silicon-containing monomers include acid-labile (active) (FIG. 8) and acid-stable (inactive) (FIG. 9) monomers. The acid labile monomers can have a two-carbon unit between the silicon and oxygen; whereas, the acid stable monomers can have either one carbon atom or three or more carbon atoms between silicon and, oxygen. As shown in FIG. 8, the acid labile monomers can also have a tertiary carbon atom attached to an ester oxygen, and the tertiary carbon is between a silicon atom and the ester oxygen. As shown in FIG. 9, the acid stable monomer can be void of any ester oxygen linking the silicon atom.

The ethylenically unsaturated portion of the monomer is typically from an acrylate, methacrylate, or cyclic-olefin.

The silicon containing polymers of the present invention can be used as a homopolymer or can be a copolymer. Suitable comonomers include acrylate, methacrylate, cyclic-olefin, maleic anhydride, and itaconic anhydride may contain in addition to active and inactive silicon groups, functional groups such as tertiary alkyl esters (t-butyl esters), actals, ketals and other acid labile groups. Preferably, the polymer contains two silicon containing monomers, one inactive and one active (acid labile). They may also contain polar groups such as carboxylic acids, sulfonamides, fluorinated alcohols.

The polymers typically have number average molecular weights of about 1000 to about 10,000, and more typically about 3000 to about 5000.

Copolymers typically contain about 10 to about 50 mol % of the acid labile silicon containing monomer and about 50 to about 90 mol % of the other monomer(s). When the inactive silicon monomer is present, such is typically employed in amounts of about 10 to about 40 mol %. When used in a bilayer resist, the polymers of the present invention are used as the top imaging layer along with a radiation sensitive acid generator.

In an alternative embodiment, the top layer contains monomeric or polymeric dissolution inhibitors in addition to the polymer. The dissolution inhibitors may contain silicon containing groups, both active and inactive.

The second component of the top imaging layer is the radiation sensitive acid generator. Upon exposure to radiation, the radiation sensitive acid generator generates a strong acid. Suitable acid generators include triflates (e.g. triphenylsulfonium triflate or bis-(t-butyl phenyl) iodonium triflate), pyrogallol (e.g. trimesylate of pyrogallol), perfluoroalkane sulfonates, bis-(t-butyl phenyl) iodonium perfluorooctane sulfonate), onium salts such as triarylsulfonium and diaryliodonium hexafluoroantimonates, hexafluoroarsenates, and others; trifluoromethane sulfonate esters of hydroxyimides, alpha-alpha'-bis-sulfonyl diazomethanes, sulfonate esters of nitro-substituted benzyl alcohols and naphthoquinone-4-diazides and alkyl disulfones. Other suitable photoacid generators are disclosed in Allen U.S. Pat. Nos. 5,045,431 and 5,071,730 and Reichmanis et al, Chemistry of Materials, Vol. 3, page 395 (1991), the disclosures of which are incorporated herein by reference for all purposes.

The two component top imaging layer generally comprises about 1 to 10 weight percent of the acid generator and about 90 to 99 weight percent of the polymer. The top imaging layer may optionally comprise other minor components such as dissolution inhibitors, coating enhancers, surfactants, bases and other compounds known to those skilled in the art. When employed, the dissolution inhibitors are present in amounts of about 1 to about 15% by weight based upon the total weight of the polymer and dissolution inhibitor. Typical dissolution inhibitors are bile-acid esters (e.g. cholate esters). See U.S. Pat. No. 5,580,694, and Wallow et al, Proc. SPIE, 2724, 335, 1996, disclosures of which are incorporated herein by reference.

Suitable organic, polymeric, planarizing underlayers for the resist of the present invention include cross-linked poly(hydroxystyrene), polyesters, polyacrylates, cyclic-olefin polymers and the like.

The present invention relates to a process for generating a positive bilayer resist image on a substrate comprising the steps of (a) coating a substrate with an organic underlayer; (b) coating the organic underlayer with a top layer comprising a radiation sensitive acid generator and a polymer having silicon containing groups some of which are acid labile; (c) imagewise exposing the top layer to radiation; (d) developing the image in the top layer; and (e) transferring the image through the organic underlayer to the substrate.

The first step of the process of the present invention involves coating the substrate with a layer comprising an organic polymer dissolved in a suitable solvent. Suitable substrates are comprises of silicon. Suitable solvents for the organic polymer underlayer include propylene glycol monomethyl ether acetate, ethyl lactate and cyclohexanone. The layer can be coated on the substrate using art-known techniques such as spin or spray coating or doctor blading. The layer is then heated to an elevated temperature of about 100–250° C. for a short period of time of about 1–30 minutes to drive off solvent and optionally thermally induce crosslinking. The dried underlayer typically has a thickness of about 0.5–20 microns, and more typically about 1 micron.

In the second step of the process, the components of the top imaging layer are dissolved in a suitable solvent such as propylene glycol monomethyl ether acetate and ethyl lactate. It is desired that the imaging layer not admix with the underlayer during the coating process. The top layer typically has a thickness of about 0.1 to 0.3 microns.

In the next step of the process, the film is imagewise exposed to radiation (UV, X-ray, e-beam, EUV), typically ultraviolet radiation suitably at a wavelength of about 190–365 nm (193/248/254/365), preferably 193 or 248 nm. Suitable radiation sources include mercury, mercury/xenon, and xenon lamps. The preferred radiation is ArF excimer laser or KrF excimer laser. At longer wavelengths (e.g. 365 nm) a sensitizer may be added to the top imaging layer to enhance absorption of the radiation. Conveniently, due to the enhanced radiation sensitivity of the top layer of the resist film, the top layer of the film is fully exposed with less than about 100 mJ/cm$^2$ of radiation, more preferably less than about 50 mJ/cm$^2$. The radiation is absorbed by the radiation sensitive acid generator to generate free acid which causes cleavage of the silicon containing acid labile group and the formation of the corresponding carboxylic acid.

Preferably, after the film has been exposed to radiation, the film is again heated to an elevated temperature of about 130° C. for a short period of time of about 1 minute.

The next step involves development of an image in the top layer with a suitable developer. Suitable developers for development of a positive image include an aqueous base, preferably a metal ion free aqueous base such as tetramethyl ammonium hydroxide or chlorine. The development results in the removal of the exposed areas of the top layer of the film.

The last step of the process involves transferring of the developed image in the top layer through the underlayer to the substrate by known techniques. Preferably, the image is transferred by etching with reactive ions such as oxygen plasma, oxygen/sulfur dioxide plasma. Suitable plasma tools include electron cyclotron resonance (ECR), helicon, inductively coupled plasma (ICP) and transmission-coupled plasma (TCP) systems. Etching techniques are well known in the art and equipment is commercially available to etch films.

The bilayer resist of the present invention may be used to make an integrated circuit assembly, such as an integrated circuit chip, multichip modules or circuit board. The integrated circuit assembly comprises a circuit formed on a substrate by using the process of the present invention and then additionally forming a circuit in the developed film on the substrate by art-known techniques. After the substrate has been exposed, circuit patterns can be formed in the exposed areas by coating the substrate with a conductive material such as conductive metals by art-known dry-etching techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p- or n-doped circuit transistors. Other means for forming circuits are well known to those skilled in the art.

The following non-limiting examples are detailed descriptions of methods of preparation and use of the resist of the present invention. The detailed preparations fall within the scope of, and serve to exemplify the more generally described methods set forth above. The examples are presented for illustrative purposes only, and are not intended as a restriction on the scope of the invention.

EXAMPLE 1

Synthesis of Bis(trimethylsilyl)methylmethacrylate

Bis(trimethylsilyl)chloromethane (Aldrich) (14.68 g, 0.075 mole), sodium methacrylate (8.96 g, 0.0825 mole), Adogen 464 (Aldrich) (1.70 g), and phenothiazine (0.05 grams) were placed in a round bottom flask equipped with a condenser, mechanical stirrer and a nitrogen inlet. The flask was charged with 200 ml acetonitrile and heated to reflux while stirring. After 4 days, the mixture was filtered to remove the solids and the solvent was removed in a rotary evaporator. Fractional distillation under reduced pressure gave 10.90 grams (60% yield) of a clear liquid at 46–48° C. at 0.5 mm pressure.

EXAMPLE 2

Synthesis of 2-Trimethylsilylethylmethacrylate

2-Trimethylsilylethanol (Aldrich) (30 g, 0.25 mole) was placed in a round bottom flask equipped with a condenser, addition funnel, magnetic stirrer and a nitrogen inlet. 200 ml dichloromethane, pyridine (20.80 g, 0.26 mole) and 100 mg of phenothiazine were added to the flask. While stirring, methacryloyl chloride (27.18 g, 0.26 mole) in 100 ml dichloromethane was added dropwise at room temperature. A mildly exothermic reaction occurred. The mixture was stirred overnight at room temperature. Afterwards, the mixture was washed with 1×100 ml deionized water and 2×100 ml brine and dried over anhydrous magnesium sulfate. The solution was concentrated in vacuo. Fractional distillation under reduced pressure gave 20.82 grams of the desired product at 35–38° C. at 0.5 mm.

EXAMPLE 3

Synthesis of a Terpolymer Comprising Bis(trimethylsilyl) methyl Methacrylate, 2-trimethylsilylethyl Methacrylate, and Itaconic Anhydride Bis(trimethylsilyl)methyl methacrylate (2.44 g, 0.01 mole), 2-trimethylsilylethyl methacrylate (2.80 g, 0.025 mole), and itaconic anhydride (2.80 g, 0.025 mole) were placed with 25 ml of tetrahydrofuran (THF) in a round bottom flask equipped with a condenser and a nitrogen inlet. Azoisobutyronitrile (AIBN) (0.33 g) was added to this solution and stirred until dissolved. Then the solution was evacuated with the aid of a Firestone valve and purged with nitrogen four times. The contents were then heated to reflux for 18 hours. Afterwards, the solution was diluted with acetone (20 ml) and added dropwise into hexanes (800 ml). The precipitated polymer was filtered (frit), washed twice with hexanes (50 ml) dried under vacuum at 60° C. Yield: 5.6 grams. Mw=13,000.

EXAMPLE 4

Synthesis of Bis(trimethylsilyl)methylacrylate

Bis(trimethylsilyl)chloromethane (Aldrich) 39 g, 0.2 mole), sodium acrylate (28 g, 0.3 mole), Adogen 464 (Aldrich) (6.96 g), and phenothiazine (0.10 grams) were placed in a round bottom flask equipped with a condenser, mechanical stirrer and a nitrogen inlet. The flask was charged with 100 ml of butyronitrile and heated to reflux while stirring. After 6 hours, the mixture was diluted with 150 ml hexanes and filtered to remove the solids. The solvents were removed under reduced pressure. Fractional distillation of the residue under reduced pressure gave 35.5 grams 975%) of the desired product at 45–58° C. at 0.5 mm pressure.

EXAMPLE 5
Synthesis of Bis(trimethylsilyl)methyl 5-Norbornene-2-carboxylate (FIG. 9, Top Row #2)

A 100 mL three-neck round-bottom flask was equipped with a thermocouple thermometer, magnetic stirrer, addition funnel with nitrogen attachment, and an ice-water cooling bath. The flask was charged with 19 grams (0.287 mol) of freshly distilled cyclopentadiene. The addition funnel was charged with 60 grams (0.26 mol) of bis(trimethylsilyl)methyl acrylate which was added to the cyclopentadiene with stirring, maintaining the temperature between 0 and 10° C. After the addition was completed the reaction was allowed to warm to room temperature and stir overnight. The reaction was distilled under vacuum collecting the fraction boiling at 98–101° C. at 100 milliTorr to yield 61 grams of product.

EXAMPLE 6
Synthesis of 2-(2-Methyl-4-trimethylsilyl)butyl 5-Norbornene-2-carboxylate (FIG. 8, Second Row #2)

Step 1: Synthesis of 2-methyl-4-trimethylsilyl-2-butanol

A 250 mL 3-neck round-bottom flask was equipped with a magnetic stirrer, dry-ice condenser with a nitrogen bubbler, thermocouple thermometer, ice water cooling bath, and a gas inlet tube attached through a back flow trap to a cylinder of trimethylsilane. The flask was charged with 68.9 g (0.80 mol) of 2-methyl-3-buten-2-ol and 600 mg of platinum-divinyl tetramethyl disiloxane complex in toluene (about 2 mol % platinum) and cooled to below 10° C. The reaction temperature was maintained between 5 and 10° C. as the silane (63 grams, 0.85 mol) was added slowly over 3 hours. The ice-water cooling bath was removed but the dry-ice condenser was maintained with dry-ice while stirring overnight. The condenser was removed and replaced with a distillation apparatus and the reaction mixture distilled under vacuum. The major fraction distilling at 105–108° C. at 200 milliTorr was collected, yielding 124 grams of product.

Step 2: Synthesis of 5-Norbornene-2-carbonylchloride

A 1 liter, three-neck round bottom flask equipped with a magnetic stirrer, thermocouple thermometer, glass stopper, addition funnel with nitrogen gas purge, and a dry-ice cooling bath was charged with 248 grams (3.75 mol) of freshly distilled cyclopentadiene which was cooled to 0° C. The addition funnel was charged with 316.8 grams (3.5 mol) of distilled acryloyl chloride which was added dropwise to the reaction over three hours while maintaining the reaction temperature between 0 and 10° C. After the acryloyl chloride addition was complete, the cooling bath was removed and the reaction allowed to warm to room temperature overnight. The reaction mixture was distilled under vacuum collecting 533 grams of product distilling at 54–56° C. at a pressure of 300 milliTorr.

Step 3: Synthesis of 2-(2-Methyl-4-trimethylsilyl)butyl 5-Norbornene-2-carboxylate A 2 liter, three-neck round-bottom flask equipped with a mechanical stirrer, thermocouple thermometer, addition funnel with a nitrogen inlet, and an ice-water bath was charged with 124 grams (0.775 mol) of 2-methyl-4-trimethylsilyl-2-butanol, 98 grams (0.969 mol) of triethylamine and 1 liter of anhydrous methylene chloride and cooled to below 10° C. The addition funnel was charged with 139.4 grams (0.89 mol) of norbornene-2-carbonylchloride which was added dropwise to the stirred reaction mixture while maintaining the internal reaction temperature below 10° C. The dark reaction mixture was allowed to warm to room temperature and stir overnight. The addition funnel was charged with 20 mL of water which was added dropwise to the stirred reaction. After stirring for several hours, the reaction mixture was evaporated, taken up in diethylether and filtered. The filtrate was washed two times with water, one with brine, dried over anhydrous sodium sulfate and then filtered and evaporated. The residue was distilled under vacuum to yield 159 grams of product distilling at 110–115° C. at a pressure of 300 milliTorr.

Figure 1:
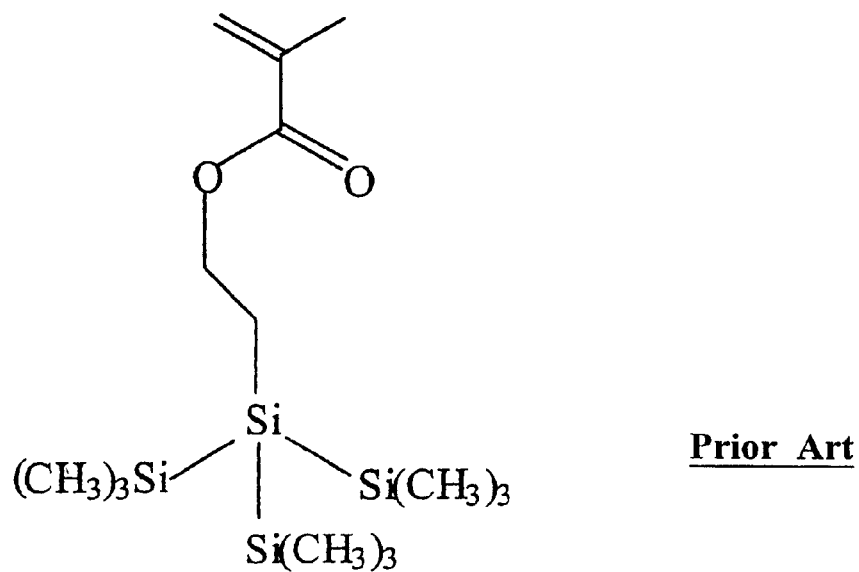
FIGS. 1, 2, 3 and 6 illustrate structures of silicon monomers not exhibiting the advantages achievable by the present invention.
Figure 2:
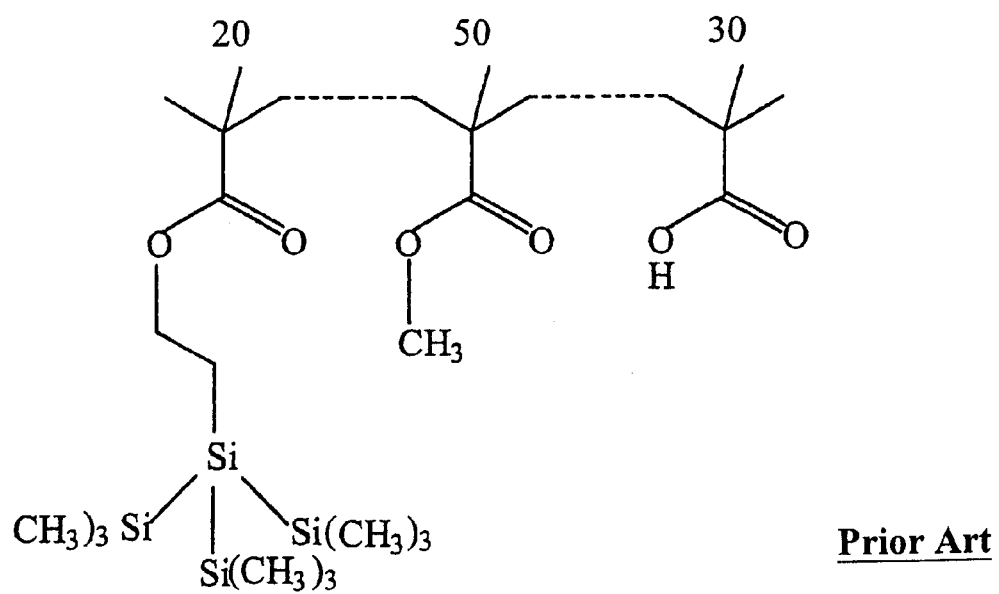
Figure 3:
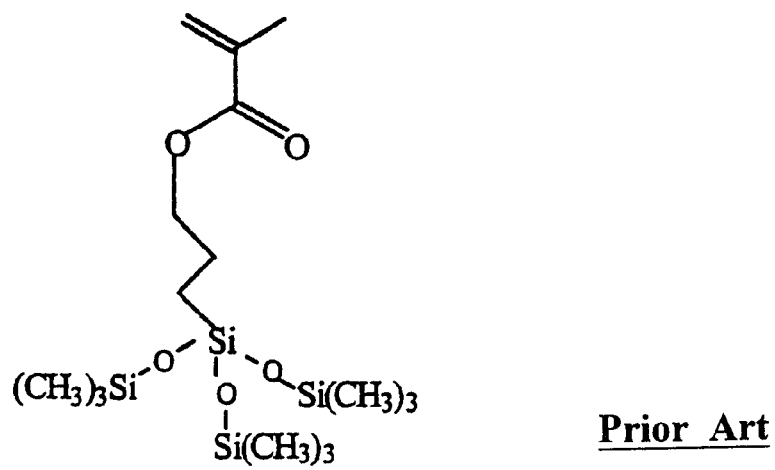
Figure 4:
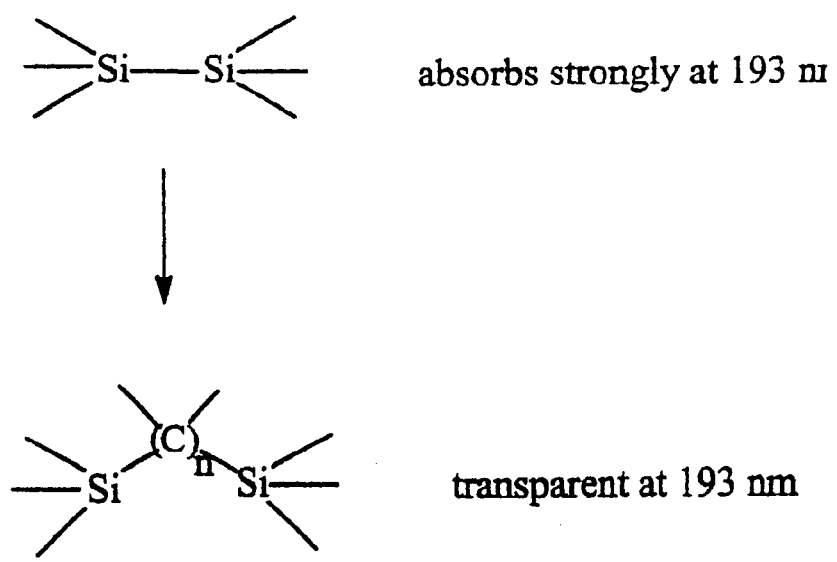
FIGS. 4 and 8 illustrate the structure of a monomer within the scope of the present invention.
Figure 5:
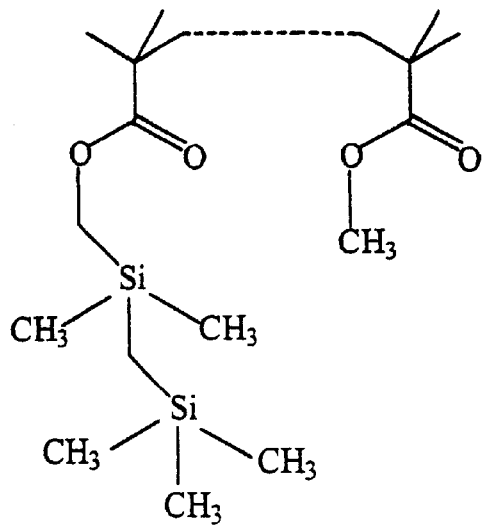
FIGS. 5 and 7 illustrate structures of copolymers of the present invention.
Figure 6:
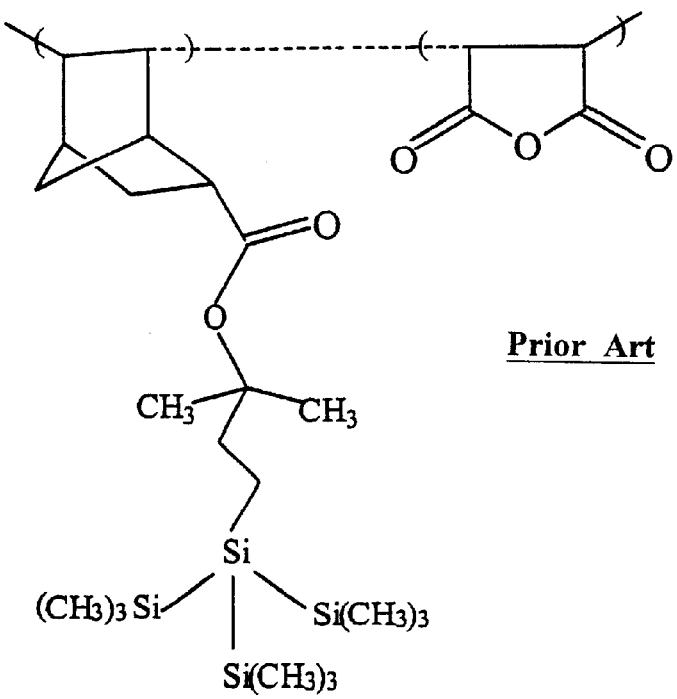
Figure 7:
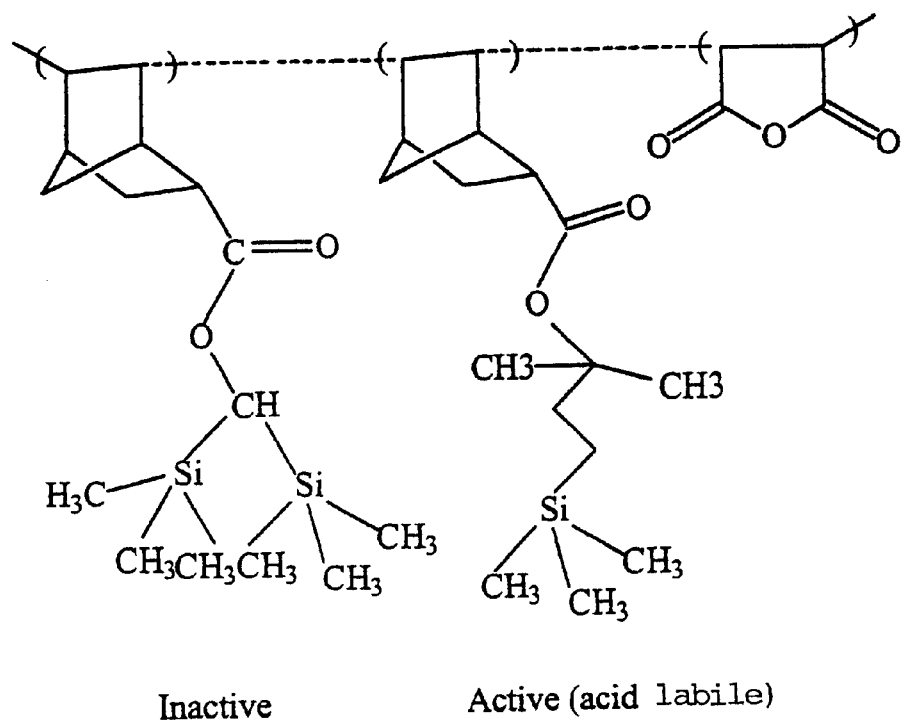

EXAMPLE 7
Synthesis of a Terpolymer (FIG. 7) Comprising Bis(trimethylsilyl)methyl 5-Norbornene-2-carboxylate (FIG. 9, Top Row #2), 2-(2-Methyl-4-trimethylsilyl)butyl 5-Norbornene-2-carboxylate (FIG. 8, Bottom Row #2), and Maleic Anhydride Bis(trimethylsilyl)methyl 5-Norbornene-2-carboxylate (5.93 g, 0.02 mole), 2-(2-methyl-4-trimethylsilyl)butyl 5-Norbornene-2-carboxylate (11.2 g, 0.04 mole) and freshly sublimed maleic anhydride (7.19 g, 0.073 mole) were placed with 28 ml of anhydrous ethylacetate in a round bottom flask equipped with a condenser and a nitrogen inlet. Azoisobutyronitrile (AIBN) (0.88 g) was added to this solution and stirred until dissolved. Then the solution was evacuated with the aid of a Firestone valve and purged with nitrogen four times. The contents were then heated to reflux for 18 hours. Afterwards, the solution was added dropwise into petroleum ether (35–60° C.) (1200 ml). The precipitated polymer was filtered (frit), washed twice with petether (50 ml) and dried under vacuum at 60° C. Yield: 13.0 grams. Mw=7000.

EXAMPLE 8
Synthesis of an Underlayer Polymer: Poly(Para-hydroxystyrene-co-epoxydicyclopentadiene Methacrylate (30:70)

A 500 mL round bottom flask was equipped with a magnetic stirrer, thermocouple thermometer, condensor with nitrogen gas bubbler attachment, and a temperature-controlled heating mantle. The flask was charged with 33.58 grams of 35.45 weight percent para-hydroxystyrene in diethylene glycol (11.9 grams para-hydroxystyrene), 54.09 grams of epoxydicyclopentadiene methacrylate, and 214 mL of isopropanol. The stirred mixture was heated to reflux, then 2.15 grams of 2,2'-azobisisobutyronitrile was added and the reaction vessel flushed with nitrogen. The mixture was kept under nitrogen and refluxed for 19 hours. The reaction mixture was then diluted with 200 mL of acetone and precipitated into 6 liters of rapidly stirred hexane. The solid product was filtered, washed with two 200 mL portions of hexane, and dried. The dried solid was suspended with stirring in a mixture of 3.5 liters of water and 200 mL of acetone for 4 hours. The solid was filtered and the water/acetone wash process repeated two more times. The solid was filtered and dried under vacuum to yield 58.0 grams of polymer. Mw=11,600.

EXAMPLE 9
193 nm Organic Underlayer Formulation

The above underlayer polymer (R—OH) (4 grams) and a thermal acid generator, di(t-butyl)iodonium perfluorooctane sulfonate (200 mg), were dissolved in a mixture of propylene glycol monomethyl ether acetate (16 grams) and cyclohexanone (4 grams).

EXAMPLE 10
193 nm Bilayer Resist Formulation (Top Imaging Layer)

Several bilayer resists were formulated. Typically, the formulation contains 95 weight percent of the bilayer polymer and 5 weight percent of a photoacid generator, di(t-butyl) iodonium perfluoroctane sulfonate, in propylene glycol monomethyl ether acetate.

EXAMPLE 11
193 nm Bilayer Resist Evaluation

A silicon substrate was coated with 0.6 microns of the organic underlayer and baked at 225° C. for 2 minutes. The underlayer was overcoated with 1500 Å of a top imaging layer composition comprising about 95 weight percent of the terpolymer in example 7 and 5 weight percent of a photoacid generator (di(t-butyl) iodonium perfluorooctane sulfonate. the films were baked at 130° C. for 1 minute to drive the solvent out. The films were then imagewise exposed at 193 nm (dose 15–100 mJ/cm$^2$). The film was then baked at 130° C. for 1 minute and the top layer was developed with 0.263 N tetramethyl ammonium hydroxide. Very high resolution images were obtained with this resist. 70 nm (1:2 line/space) patterns were resolved when exposed through an alternating phase shift mask. The images were straight walled and without any residue.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for generating a bilayer resist image on a substrate comprising:
   (a) coating a substrate with an organic underlayer;
   (b) coating the organic underlayer with a top layer comprising:
      (i) a radiation sensitive acid generator and
      (ii) a polymer polymerized from a silicon-containing monomer that is acid-labile and a silicon-containing monomer that is acid-stable, and the acid-stable the silicon monomers containing an ethylenically unsaturated group, monomer has a silicon atom separated from an ester oxygen by one methylene carbon atom, or is void of any ester oxygen linking the silicon atom;
   (c) imagewise exposing the top layer to radiation;
   (d) developing the image in the top layer; and
   (e) transferring the image through the organic underlayer to the substrate.

2. The process of claim 1 wherein the polymer is polymerized from more than one silicon-containing monomer that is acid-labile.

3. The process of claim 1 wherein the polymer is polymerized from more than one acid-stable silicon monomer and more than one acid-labile silicon monomer.

4. The process of claim 1 wherein the polymer has polar groups.

5. The process of claim 1 wherein the acid generator is selected from perfluoroalkane sulfonates, onium salts, trifluoromethane sulfonate esters of hydroxyimides, alpha-alpha'-bis-sulfonyl diazomethanes, sulfonate esters of nitro-substituted benzyl alcohols and of naphthoquinone-4-diazides and alkyl disulfones.

6. The process of claim 1 wherein the top layer is imagewise exposed to radiation having a wavelength of 193 nm.

7. The process of claim 1 wherein the top layer is imagewise exposed to radiation having a wavelength of 248 nm.

8. The process of claim 1, wherein the underlayer is an organic polymer comprising one or more of the monomers selected from the group consisting of acrylate, cyclic-olefin, hydroxystyrene, and epoxy monomers.

9. The process of claim 1 wherein the top layer further comprises a dissolution inhibitor.

10. The process of claim 9 wherein the dissolution inhibitor contains silicon.

11. The process of claim 1 wherein the ethylenically unsaturated group is selected from the group consisting of acrylate, methacrylate, and cyclic olefin.

12. The process of claim 11 wherein the cyclic olefin is norbornene.

13. The process of claim 1 wherein the polymer is polymerized in the presence of one or more comonomers selected from the group consisting of acrylate, methacrylate, cyclic olefin, maleic anhydride, and itaconic anhydride.

14. The process of claim 1 wherein the silicon-containing monomer that is acid-labile contains more than one silicon group that is acid-labile.

15. The process of claim 1 wherein the silicon-containing monomer that is acid-stable contains more than one silicon group that is acid-stable.

16. The process of claim 1 wherein the acid-labile monomer has a two-carbon ethylene unit between a silicon atom and an ester oxygen.

17. The process of claim 16 wherein the acid-stable monomer is void of any ester oxygen linking the silicon atom.

18. The process of claim 16 wherein the acid-stable monomer has one methylene carbon atom between the silicon atom and the ester oxygen.

19. The process of claim 1 wherein the acid-labile monomer has a tertiary carbon atom attached to an ester oxygen, and the tertiary carbon is between a silicon atom and the ester oxygen.

20. The process of claim 19 wherein the acid-stable monomer is void of any ester oxygen linking the silicon atom.

21. The process of claim 19 wherein the acid-stable monomer has one methylene carbon atom between the silicon atom and the ester oxygen.

22. A process for generating a bilayer resist image on a substrate comprising:
   (a) coating a substrate with an organic underlayer;
   (b) coating the organic; underlayer with a top layer comprising:
      (i) a radiation sensitive acid generator and
      (ii) a polymer polymerized from a silicon-containing monomer that is acid-labile and a silicon-containing monomer that is acid-stable, wherein the polymer is polymerized from more than one silicon-containing monomer that is acid-labile;
   (c) imagewise exposing the top layer to radiation;
   (d) developing the image in the top layer; and
   (e) transferring the image through the organic underlayer to the substrate.

23. A process for generating a bilayer resist image on a substrate comprising:
  (a) coating a substrate with an organic underlayer;
  (b) coating the organic underlayer with a top layer comprising:
    (i) a radiation sensitive acid generator and
    (ii) a polymer polymerized from a silicon-containing monomer that is acid-labile and a silicon-containing monomer that is acid-stable, wherein the polymer is polymerized from more than one acid-stable silicon monomer and more than one acid-labile silicon monomer;
  (c) imagewise exposing the top layer to radiation;
  (d) developing the image in the top layer; and
  (e) transferring the image through the organic underlayer to the substrate.

24. A process for generating a bilayer resist image on a substrate comprising:
  (a) coating a substrate with an organic underlayer;
  (b) coating the organic underlayer with a top layer comprising:
    (i) a radiation sensitive acid generator and
    (ii) a polymer polymerized from a silicon-containing monomer that is acid-labile and a silicon-containing monomer that is acid-stable, wherein the silicon monomers contain a norbornene group;
  (c) imagewise exposing the top layer to radiation;
  (d) developing the image in the top layer; and
  (e) transferring the image through the organic underlayer to the substrate.

25. A process for generating a bilayer resist image on a substrate comprising:
  (a) coating a substrate with an organic underlayer;
  (b) coating the organic underlayer with a top layer comprising:
    (i) a radiation sensitive acid generator and
    (ii) a polymer polymerized from a silicon-containing monomer that is acid-labile and a silicon-containing monomer that is acid-stable, wherein the silicon-containing monomer that is acid-labile contains more than one silicon group that is acid-labile;
  (c) imagewise exposing the top layer to radiation;
  (d) developing the image in the top layer; and
  (e) transferring the image through the organic underlayer to the substrate.

26. A process for generating a bilayer resist image on a substrate comprising:
  (a) coating a substrate with an organic underlayer;
  (b) coating the organic underlayer with a top layer comprising:
    (i) a radiation sensitive acid generator and
    (ii) a polymer polymerized from a silicon-containing monomer that is acid-labile and a silicon-containing monomer that is acid-stable, wherein the silicon-containing monomer that is acid-stable contains more than one silicon group that is acid-stable;
  (c) imagewise exposing the top layer to radiation;
  (d) developing the image in the top layer; and
  (e) transferring the image through the organic underlayer to the substrate.

* * * * *

UNITED STATES PATENT AND TRADEMARK OFFICE
CERTIFICATE OF CORRECTION

PATENT NO. : 6,444,408 B1
DATED : September 3, 2002
INVENTOR(S) : Brock et al.

It is certified that error appears in the above-identified patent and that said Letters Patent is hereby corrected as shown below:

Column 10,
Line 55, change "(b) coating the organic; underlayer with a top layer" to
-- (b) coating the organic underlayer with a top layer --

Signed and Sealed this

Tenth Day of February, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,444,408 B1
DATED         : September 3, 2002
INVENTOR(S)   : Brock et al.

It is certified that error appears in the above-identified patent and that said Letters Patent is hereby corrected as shown below:

<u>Column 9,</u>
Lines 45-47, change "monomer that is acid-stable, and the acid-stable the silicon monomers containing an ethylenically unsaturated group, monomer has a silicon atom separated" to
-- monomer that is acid-stable, the silicon monomers containing an ethylenically unsaturated group, and the acid-stable monomer has a silicon atom separated --

Signed and Sealed this

Eleventh Day of May, 2004

JON W. DUDAS
*Acting Director of the United States Patent and Trademark Office*